US012781382B2

(12) United States Patent
Li et al.

(10) Patent No.: US 12,781,382 B2
(45) Date of Patent: Nov. 3, 2026

(54) LIQUID SILICON SPILL CONTAINMENT AND DETECTION SYSTEM

(71) Applicant: Linton Kayex Technology Co., Ltd, Wuxi City (CN)

(72) Inventors: Zhixin Li, Wuxi City (CN); Liu Hai, Wuxi City (CN)

(73) Assignee: Linton Kayex Technology Co., Ltd, Wuxi City (CN)

( * ) Notice: Subject to any disclaimer, the term of this patent is extended or adjusted under 35 U.S.C. 154(b) by 208 days.

(21) Appl. No.: 18/183,152

(22) Filed: Mar. 13, 2023

(65) Prior Publication Data

US 2024/0167192 A1 May 23, 2024

(30) Foreign Application Priority Data

Nov. 23, 2022 (CN) ......................... 202211475024.3

(51) Int. Cl.
*C30B 15/20* (2006.01)
*C30B 15/14* (2006.01)
*C30B 15/30* (2006.01)
*C30B 29/06* (2006.01)

(52) U.S. Cl.
CPC .............. *C30B 15/20* (2013.01); *C30B 15/14* (2013.01); *C30B 15/30* (2013.01); *C30B 29/06* (2013.01)

(58) Field of Classification Search
CPC ......... C30B 15/10; C30B 15/14; C30B 15/20; C30B 15/30; C30B 29/06
See application file for complete search history.

(56) References Cited

U.S. PATENT DOCUMENTS 6,348,870 B1 2/2002 Anderson
6,605,152 B2 8/2003 Mizuishi
2011/0060467 A1* 3/2011 Orschel .................. G05B 11/06 700/275
2013/0276722 A1* 10/2013 Bronson ............ G05D 23/1852 122/19.2

FOREIGN PATENT DOCUMENTS

CN 112281209 A * 1/2021 ............ C30B 15/20
JP 2009215126 A * 9/2009
JP 2011126730 A * 6/2011
JP 2021088478 A * 6/2021

* cited by examiner

*Primary Examiner* — Hua Qi
(74) *Attorney, Agent, or Firm* — Nixon Peabody LLP

(57) ABSTRACT

A single crystal furnace includes a furnace body, a thermal-field assembly, and a spill tray. The thermal-field assembly includes a crucible for carrying a forming material, a heater for heating the forming material from a solid state into a melt, and an insulation member located below the crucible and including an overflow hole. The spill tray is located in the furnace body below the insulation member. The spill tray receives any portion of the melt leaking from the crucible and flowing through the overflow hole.

16 Claims, 3 Drawing Sheets

LIQUID SILICON SPILL CONTAINMENT AND DETECTION SYSTEM

CROSS REFERENCE TO RELATED APPLICATIONS

The present application claims the benefit of Chinese Patent Application No. 202211475024.3, which was filed on Nov. 23, 2022, and titled "Single Crystal Furnace," which is hereby incorporated by reference in its entirety.

FIELD OF THE INVENTION

The present invention relates generally to a crystal growing furnace, and, more particularly, to a system for preventing or reducing melt-leakage damage to a furnace body.

BACKGROUND OF THE INVENTION

With the development of science and technology, applications of single crystal furnaces are becoming more and more extensive. Generally, crystals, such as sapphire and silicon crystals, can be made through a single crystal furnace. Typically, the single crystal furnace includes a furnace body having a crucible and a heater. The forming material is placed in the crucible, which is heated by the heater such that the material in the crucible melts to form a melt. Then, the melt is pulled to form into a respective crystal. However, if the melt in the crucible leaks (as sometimes happens), the melt causes damage to the bottom of the furnace body.

Thus, there is a great need for providing a single crystal furnace that prevents or reduces the above and other problems.

SUMMARY OF THE INVENTION

According to one embodiment of the present disclosure, single crystal furnace includes a furnace body, a thermal-field assembly, and a spill tray. The thermal-field assembly includes a crucible for carrying a forming material, a heater for heating the forming material from a solid state into a melt, and an insulation member located below the crucible and including an overflow hole. The spill tray is located in the furnace body below the insulation member. The spill tray receives any portion of the melt leaking from the crucible and flowing through the overflow hole.

According to an alternative embodiment, the single crystal furnace includes an alarm assembly located outside the furnace body. The alarm assembly is electrically coupled to a sensor, and is configured to issue an alarm notification when the melt flows into the spill tray through the overflow hole and makes contact with the sensor.

According to another alternative embodiment, the single crystal furnace includes a controller outside the furnace body. The controller is electrically coupled to the alarm assembly and the sensor, and is configured to receive a detection signal from the sensor when contact is made between the sensor and the melt. The controller is further configured to control the alarm to issue the alarm notification in response to receiving the detection signal.

According to yet another alternative embodiment, the heater is electrically coupled to the controller. The controller is configured to stop the heater from heating in response to receiving the detection signal.

According to yet another alternative embodiment, the single crystal furnace includes a lifting member that is electrically coupled to the controller. The lifting member is configured to lift the forming material into the furnace body, and the controller is configured to cause movement of the lifting member. The movement is such that the forming material is positioned above the thermal-field assembly in response to receiving the detection signal, resulting in the forming material being separated from the thermal-field assembly.

According to yet another alternative embodiment, the overflow hole is located directly opposite relative to the sensor.

According to yet another alternative embodiment, the spill tray has a bottom surface connected with a side wall. The side wall surrounds the bottom surface in a circumferential direction of the bottom surface, and has a mounting hole. The sensor is in the form of a resistance wire that is disposed on the bottom surface, through the mounting hole, for electrically connecting the sensor to the alarm assembly.

According to yet another alternative embodiment, the single crystal furnace includes a seal between the resistance wire and a hole surface of the mounting hole. The seal is configured to seal a gap between the resistance wire and the hole surface.

According to yet another alternative embodiment, the resistance wire is wrapped with an insulating material. The insulating material isolates the resistance wire from the bottom surface to avoid electrical conduction between the resistance wire and the bottom surface.

According to yet another alternative embodiment, the spill tray is mounted in contact with a bottom surface of the furnace body.

According to yet another alternative embodiment, the spill tray is mounted on an inner side wall of the furnace body.

The single crystal furnace of the present disclosure is beneficial at least because it solves the problem of the melt leakage in the crucible, preventing or reducing damage to the bottom of the furnace body. For example, the melt leakage flows to the insulation member, through the overflow hole, and to the spill tray. This flow path avoids direct contact between the melt leakage and the bottom surface of the furnace body. Thus, providing a spill tray below the thermal-field assembly, under the insulation member, and providing an overflow hole in the insulation member avoid (or reduces) melt leaking from the crucible directly onto the bottom surface of the furnace body. Consequently, damage to the furnace body is avoided, or greatly reduced.

Additional aspects of the disclosure will be apparent to those of ordinary skill in the art in view of the detailed description of various embodiments, which is made with reference to the drawings, a brief description of which is provided below.

Figure 1:
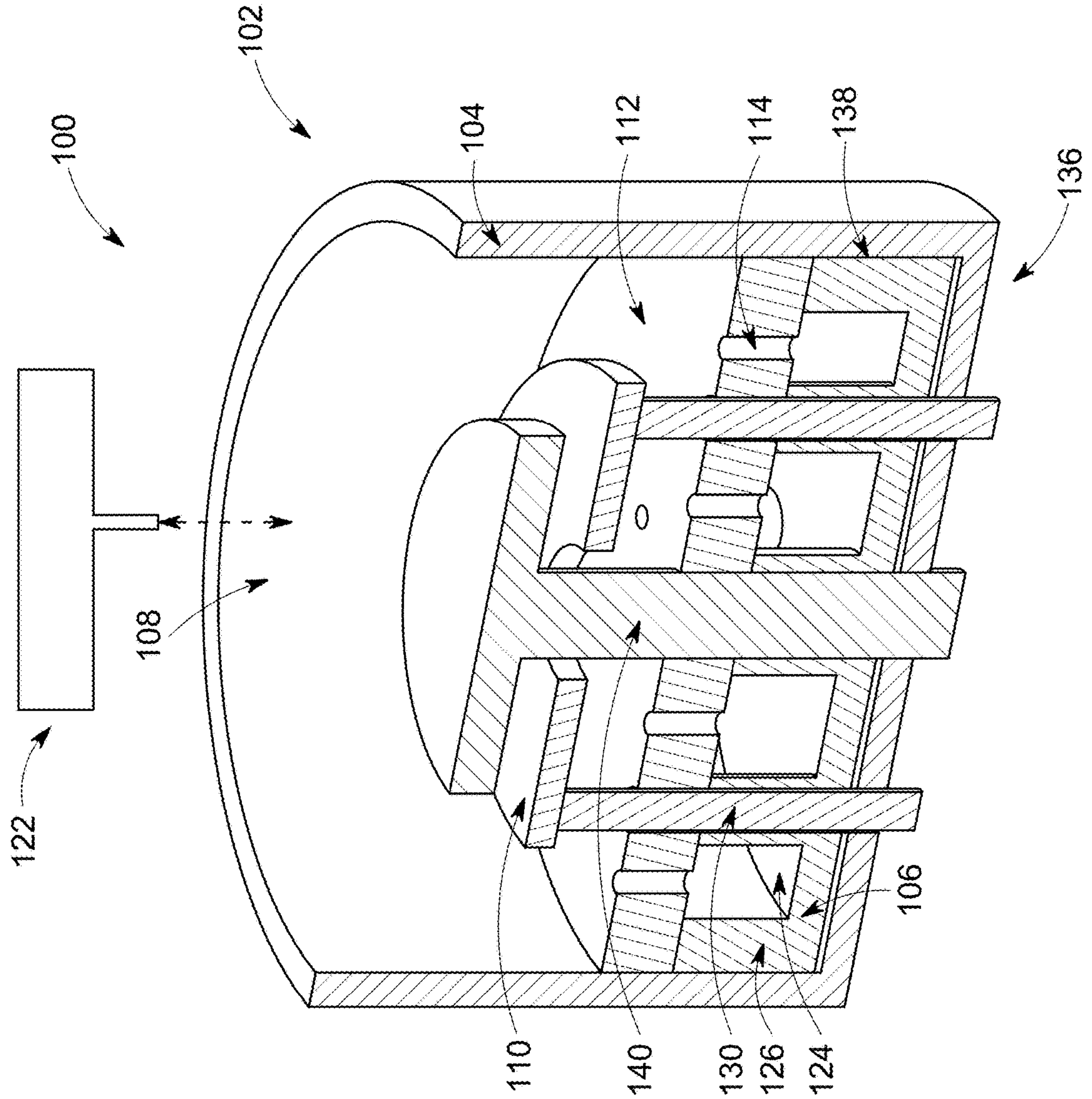
FIG. 1 is a schematic illustration of a single crystal furnace, according to an embodiment of the present disclosure.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Generally, an embodiment of the present disclosure is directed to a single crystal furnace for growing silicon crystal structure in accordance with the Czochralski ("CZ") Crystal Growth Process. The single, or CZ, crystal furnace produces monocrystalline ingots, also referred to as "single crystal" ingots. The single crystal furnace includes a furnace body, a thermal-field assembly, and a spill tray. The thermal-field assembly, which is located in the furnace body, is typically referred to in the industry as a hotzone, which includes graphite components, such as an insulation member, a crucible, and a heater.

The crucible is used to carry the crystal-growing material, while the heater is used to heat the crystal-growing material until it becomes a melt. The insulation member is located under the crucible and is provided with an overflow hole.

The spill tray is located under the insulation member and is used to hold any portion of the melt leaking from the crucible and flowing out of the overflow hole. The spill tray, which is located in the furnace body, together with the insulation member form a spill tray of the single crystal furnace. The spill tray is located on the bottom of the hotzone.

Figure 2:
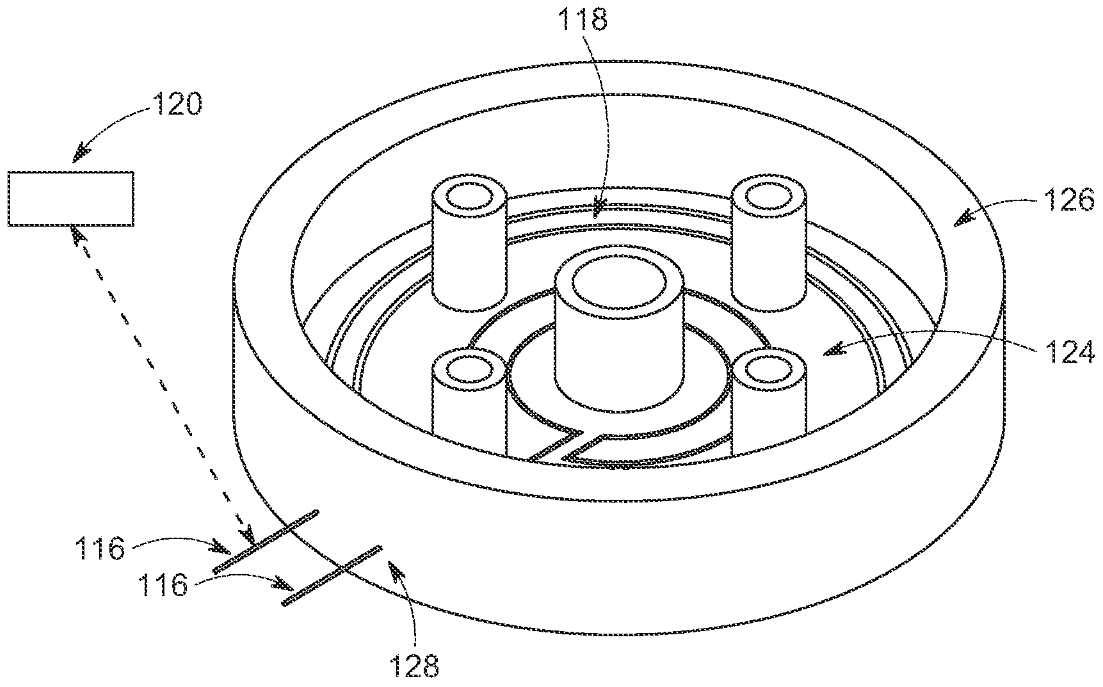
FIG. 2 is a schematic representation of a spill tray, according to another embodiment of the present disclosure.
Figure 3:
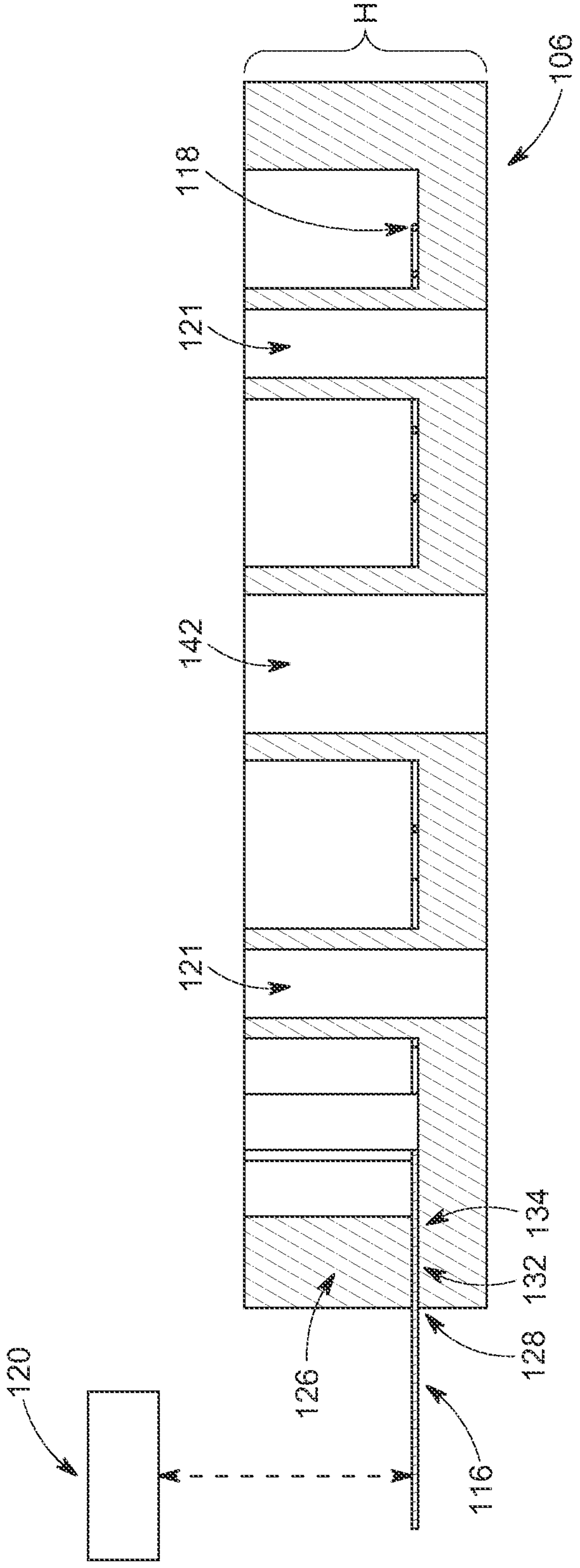
FIG. 3 is a cross-sectional representation of the spill tray of FIG. 2.

Referring to FIGS. 1-3, a single crystal furnace 100 includes a furnace body 102, a thermal-field assembly 104, and a spill tray 106. The thermal-field assembly 104 and the spill tray 106 are located in the furnace body 102. The thermal-field assembly 104 includes a crucible 108, a heater 110, and an insulation member 112. The crucible 108 is used to carry forming material, and the heater 110 is used to heat the forming material from a solid state into a melt.

The insulation member 112 is located below the crucible 108 and includes an overflow hole 114. The spill tray 106 is located below the insulation member 112, and is used to carry a leak from the crucible 108, and from the overflow hole 114.

After the forming material is placed in the crucible 108, the heater 110 heats the forming material and melts it in the crucible 108 into a melt. If the melt leaks from the crucible 108, the melt flows to the insulation member 112, and through the overflow hole 114. Because the spill tray 106 is located below the insulation member 112, the melt flows out of the overflow hole 114 into the spill tray 106. Thus, the spill tray 106 contains the fluid leaking from the crucible 108, avoiding direct contact with a bottom portion of the furnace body 102. Consequently, damage to the furnace body 102 is avoided, or reduced.

The material in the crucible 108 after the formation of a melt has a temperature that is usually higher than before the melt. For example, the temperature of the melt may reach over 1000° C., e.g., 1410° C. (2570° F.). Thus, to carry the high-temperature melt the spill tray 106 cannot be damaged by the melt. To avoid or reduce melt damage, the spill tray 106 is made, for example, from a tray material that is a high-temperature resistant material. For example, the tray material of the spill tray 106 is a carbon-carbon composite material, which also has a high strength. The tray material can withstand the impact of stress caused by melt solidification, melt cooling, and other processes. The tray material withstands without rupture, which better protects the furnace body 102, preventing potentially damaging risks. According to another example, the tray material of the spill tray 106 includes a silica material.

According to an exemplary configuration of the present disclosure, a height range of the spill tray 106 is in the range of about 10 millimeters (mm) to about 1000 mm. According to specific examples, the height of the spill tray 106 is 10 mm, 100 mm, 300 mm, 600 mm, 800 mm, and 1,000 mm. The height H (shown in FIG. 3) of the spill tray 106 refers to a distance between opposite ends of the spill tray 106 parallel to a longitudinal direction between the insulation member 112 and the crucible 108.

According to an alternative embodiment, the single crystal furnace 100 also includes an alarm assembly 116. Specifically, the spill tray 106 is electrically coupled to the alarm assembly 116, which is located outside the furnace body 100. If the melt flows unto the spill tray 106, through the overflow hole 114, and makes contact with a sensor 118, the alarm assembly 116 issues an alarm notification. Thus, when a melt leak is indicated, the alarm assembly 116 alerts staff to take remedial action.

Optionally, the alarm assembly 116 includes a buzzer that emits a sound alarm, such as a beep, to prompt the staff and alert of the potential leak problem. In addition to or instead of the sound alarm, the alarm assembly 116 also emits a light alarm that flashes to alert the staff. The sound and light alarms may be emitted simultaneously or sequentially, e.g., the sound alarm is first emitted and then the light alarm is flashed. The light alarm is optionally emitted via a light-emitting diode (LED) light. According to other embodiments, the alarm assembly 116 includes other alarm components that can alert the staff to potential leak problems.

According to an alternative embodiment, the single crystal furnace 100 also includes a controller 120. The controller 120 is located outside the furnace body 102 and is electrically coupled to the alarm assembly 116. If a potential leak is detected, the sensor 118 sends a detection signal to the controller 120, and the controller 120 controls the alarm assembly 116 based on the detection signal.

According to an optional configuration, the controller 120 is a programmable logic controller (PLC). In other optional configuration, the controller 120 is any control chip configured to control the alarm assembly 116 as disclosed in the present disclosure.

In applicable configurations, the buzzer and the light are each electrically connected to the controller 120. Accordingly, by way of example, the controller 120 controls the buzzer to beep and the light to emit to flash. The controller 120 controls separately, simultaneously, or sequentially the buzzer to emit the audio alarm and the light to emit the light alarm.

According to another optional configuration, the heater 110 is electrically connected to the controller 120. If the controller 120 receives the detection signal, the controller 120 controls the heater 110 to stop the heating process. Thus, when the heater 110 is electrically connected to the controller 120, the controller 120 controls the heater 110 so that the heater 110 emits heat, which heats the crucible 108, which melts the forming material into the melt. Additionally, based on the electrical connection between the heater 110 and the controller 120, the sensor 118 sends the detection signal when the melt makes contact with the sensor 118, in response to the melt leaking from the crucible 108 and flowing to the insulation member 112, through the overflow hole 114 and into the spill tray 106. Stopping the heater 110 from running, or emitting heat, results in an overall safer process for forming crystals through the single crystal furnace 100.

According to an alternative embodiment, the heater 110 includes a heating element controlled by the controller 120, which controls the power supply. The controller 120 controls the heater 110 to turn on or off. After turning the heating element on, the heating element heats up to generate heat. After turning the heating element off, the heating element stops heating.

According to an alternative embodiment, the single crystal furnace 100 includes a lifting member 122 that is electrically connected to the controller 120. The lifting member 122 is configured to lift the forming material into the furnace body 102, including moving the forming material out of the crucible 108. If a melt leak occurs, the controller 120 is configured to move the lifting member 122 above the thermal-field assembly 104 to free, or separate, the forming material from the thermal field assembly 104. Consequently, crystals that have already been formed before the leakage are less affected by any leaked melt, which results in a safer process.

Optionally, the lifting member 122 is usually provided with seed crystals placed close to the crucible 108. The melt in the crucible 108 attaches to the seed crystals to form the resulting single crystal, with movement of the lifting member 122 above the thermal-field assembly 104 resulting in pulling the formed single crystal.

According to an alternative embodiment, the lifting member 122 includes a motor connected to a lifting rod, which is located above the furnace body 102. The lifting rod optionally includes a winding cable. According to one example, when the crystal pulling is performed, a seed crystal is provided on the lifting rod and the motor drives the lifting rod to move up and down such that the melt in the crucible 108 attaches to the seed crystal to form the single crystal.

According to an alternative embodiment, the overflow hole 114 is positioned facing at least a portion, or opposite, of the sensor 118. Placing the overflow hole 114 opposite to the sensor 118 reduces a time delay between the detection of the melt leakage and the alarm notification, resulting in the alarm assembly 116 detecting the melt leakage as soon as possible.

According to an alternative embodiment, the sensor 118 is in the form of a resistance wire that is disposed on a bottom surface 124 of the spill tray 106, which is connected to a side wall 126 of the spill tray 106. According to an example, the resistance wire is a heating wire, such as a thermocouple wire. The side wall 126 surrounds the bottom surface 124 in a circumferential direction of the bottom surface 124, and includes a mounting hole 128. The resistant wire is threaded through the mounting hole 128, and is electrically connected to the alarm assembly 116, electrically connecting the sensor 118 to the alarm assembly 116. Thus, if a melt leakage occurs and spill unto the resistance wire, the contact between the melt leakage and the resistance wire causes the resistance wire to heat, generating the detection signal and ultimately resulting in the alarm assembly 116 issuing the alarm notification (e.g. sound and/or light).

According to an alternative embodiment, the resistance wire is connected to the controller 120 via a conductive wire. One end of the conductive wire is connected to the resistance wire, while the other end of the conductive wire passes through a through-hole 128 of the furnace body 102 and is connected to the controller 120. As such, the conductive wire is an intermediate component between the controller 120 and the sensor 118 (which in this example is the resistance wire). The through-hole 121 of the furnace body 102 is also referred to as an electrode hole or electrode opening for an electrode 130, which is connected to the heater 110 and will pass through to the spill tray 106.

According to an alternative embodiment, a groove is provided on the bottom surface 124 of the spill tray 106. The resistance wire is embedded in the groove such that it is disposed on the bottom surface 124. Alternatively, the resistance wire is fixed to the bottom surface 124 via other mechanical attachments.

According to an alternative embodiment, a seal 132 is provided between the resistance wire and a hole surface 134 of the mounting hole 128. The seal 132 is configured to seal a gap between the resistance wire and the hole surface 134. Based on the presence of the seal 132, when melt leaks into the spill tray 106, the leaked melt cannot easily leak from the mounting hole 128, and, as such, is contained within the spoil tray 106. Optionally, the seal 132 is in the form of a cloth or other material. Optionally, yet, the seal 132 includes a silicon material, a quartz material, and/or other high-temperature resistant materials.

According to an alternative embodiment, the resistance wire is wrapped with an insulating cloth or other material. The insulating material isolates the resistance wire from the bottom surface 124 of the spill tray 106, to avoid electrical conduction between the resistance wire and the spill tray 106. The electrical isolation between the resistance wire and the spill tray 106 improves the safety of the crystal forming process.

According to an optional configuration, the spill tray 106 is in contact with a bottom surface 136 of furnace body 102. One benefit of this configuration is that it provides a convenient manner to install the spill tray 106. Alternatively, the spill tray 106 is fixed, or mounted, on an inner side wall 138 of the furnace body 102. One benefit of this configuration is that the spill tray 106 is fixed in place and is not easy to shake or otherwise move.

According to an alternative embodiment, a gap is present between an outer wall of the spill tray 106 and the inner wall 138 of the furnace body 102. The gap is within a present range, ensuring a small distance separating the outer wall of the spill tray 106 and the inner wall 138 of the furnace body 102. According to some examples, the present range is about 1-2 centimeters (cm) or about 5-15 mm.

According to an alternative embodiment, the furnace body further includes a crucible shaft 140 that is connected to the crucible 108. The crucible shaft 140 drives the crucible 108 to rotate. Optionally, the crucible shaft 140 is disposed through an opening in the spill tray 106. The crucible shaft 140 includes a crucible-shaft opening 142, which is in the form of a through-hole.

In the present disclosure, the process steps of crystal pulling usually include one or more charging, evacuation, melting and feeding, temperature stabilization, crystal introduction, shouldering, shoulder turning, equating diameter, finishing, and others.

Each of these embodiments and obvious variations thereof is contemplated as falling within the spirit and scope of the claimed invention, which is set forth in the following claims. Moreover, the present concepts expressly include any and all combinations and sub-combinations of the preceding elements and aspects. The present disclosure is not limited to the specific illustrated example but extends to alternative embodiments other shapes and/or configurations in accordance with the knowledge of one of ordinary skill in the art applied consistent with the presently disclosed principles.

What is claimed is:

1. A single crystal furnace comprising:

a furnace body having an electrode hole;

a thermal-field assembly located in the furnace body, the thermal-field assembly including a crucible for carrying a forming material positioned along the furnace body, a heater for heating the forming material from a solid state into a melt, and an insulation member located below the crucible and including at least two overflow holes positioned within the furnace body;

a spill tray located in the furnace body below the insulation member, the spill tray receiving any portion of the melt leaking from the crucible and flowing through at least one of the at least two overflow holes;

an electrode passing through the electrode hole of the furnace body, the electrode being connected to the heater and passing through to the spill tray, the electrode further passing through the insulation member between one of the at least two overflow holes and another one of the at least two overflow holes;

an alarm assembly located outside the furnace body, the alarm assembly being electrically coupled to a sensor, the alarm assembly being configured to issue an alarm notification when the melt flows into the spill tray through at least one of the at least two overflow holes and makes contact with the sensor;

a controller outside the furnace body, the controller being electrically coupled to the alarm assembly and the sensor, the controller being configured to receive a detection signal from the sensor when contact is made between the sensor and the melt, and control the alarm assembly to issue the alarm notification in response to receiving the detection signal; and a lifting member that is electrically coupled to the controller, the lifting member being configured to lift the forming material into the furnace body, the controller being configured to cause movement of the lifting member such that the forming material is positioned above the thermal-field assembly in response to receiving the detection signal, the forming material being separated from the thermal-field assembly;

wherein the heater is electrically coupled to the controller, the controller being further configured to stop the heater from heating in response to receiving the detection signal.

2. The single crystal furnace of claim 1, wherein the spill tray has a bottom surface connected with a side wall, the side wall surrounding the bottom surface in a circumferential direction of the bottom surface, the side wall having a mounting hole, and wherein the sensor is in the form of a resistance wire that is disposed on the bottom surface through the mounting hole for electrically connecting the sensor to the alarm assembly.

3. The single crystal furnace of claim 2, further comprising a seal between the resistance wire and a hole surface of the mounting hole, the seal being configured to seal a gap between the resistance wire and the hole surface.

4. The single crystal furnace of claim 2, wherein electrical conduction is avoided between the resistance wire and the bottom surface.

5. The single crystal furnace of claim 1, wherein the spill tray is mounted in contact with a bottom surface of the furnace body.

6. The single crystal furnace of claim 1, wherein the spill tray is mounted on an inner side wall of the furnace body.

7. A single crystal furnace comprising:

a furnace body having an electrode hole;

a thermal-field assembly located in the furnace body, the thermal-field assembly including a crucible for carrying a forming material, a heater for heating the forming material from a solid state into a melt, and an insulation member located below the crucible and including at least two overflow holes;

a spill tray located in the furnace body below the insulation member, the spill tray receiving any portion of the melt leaking from the crucible and flowing through at least one of the at least two overflow holes;

an electrode passing through the electrode hole of the furnace body, the electrode being connected to the heater and passing through to the spill tray, the electrode further passing through the insulation member between one of the at least two overflow holes and another one of the at least two overflow holes;

an alarm assembly located outside the furnace body, the alarm assembly being electrically coupled to a sensor, the alarm assembly being configured to issue an alarm notification when the melt flows into the spill tray through at least one of the at least two overflow holes and makes contact with the sensor;

and a controller outside the furnace body, the controller being electrically coupled to the alarm assembly and the sensor, the controller being configured to receive a detection signal from the sensor when contact is made between the sensor and the melt, and control the alarm assembly to issue the alarm notification in response to receiving the detection signal.

8. The single crystal furnace of claim 7, wherein the spill tray has a bottom surface connected with a side wall, the side wall surrounding the bottom surface in a circumferential direction of the bottom surface, the side wall having a mounting hole, and wherein the sensor is in the form of a resistance wire that is disposed on the bottom surface through the mounting hole for electrically connecting the sensor to the alarm assembly.

9. The single crystal furnace of claim 8, further comprising a seal between the resistance wire and a hole surface of the mounting hole, the seal being configured to seal a gap between the resistance wire and the hole surface.

10. The single crystal furnace of claim 7, wherein the spill tray is mounted in contact with a bottom surface of the furnace body.

11. The single crystal furnace of claim 7, wherein the spill tray is mounted on an inner side wall of the furnace body.

12. A single crystal furnace comprising:

a furnace body having an electrode hole;

a thermal-field assembly located in the furnace body, the thermal-field assembly including a crucible for carrying a forming material, a heater for heating the forming material from a solid state into a melt, and an insulation member located below the crucible and including at least two overflow holes;

a spill tray located in the furnace body below the insulation and having a bottom surface;

an electrode passing through the electrode hole of the furnace body, the electrode being connected to the heater and passing through to the spill tray, the electrode further passing through the insulation member between one of the at least two overflow holes and another one of the at least two overflow holes;

a lifting member configured to lift the forming material into the furnace body, an alarm assembly located outside the furnace body, the alarm assembly being electrically coupled to a sensor, the sensor being in the form of a resistance wire that is disposed on the bottom surface of the spill tray;

a controller outside the furnace body, the controller being electrically coupled to the alarm assembly, the sensor, the lifting member, and the heater, the controller being configured to receive a detection signal from the sensor when contact is made between the sensor and the melt, control the alarm assembly to issue an alarm notification in response to receiving the detection signal, cause movement of the lifting member such that the forming material is positioned above the thermal-field assembly in response to receiving the detection signal, the forming material being separated from the thermal-field assembly, and stop the heater from heating in response to receiving the detection signal.

13. The single crystal furnace of claim 12, wherein the bottom surface is connected with a side wall, the side wall surrounding the bottom surface in a circumferential direction of the bottom surface, the side wall having a mounting hole.

14. The single crystal furnace of claim 13, further comprising a seal between the resistance wire and a hole surface of the mounting hole, the seal being configured to seal a gap between the resistance wire and the hole surface.

15. The single crystal furnace of claim 12, wherein the spill tray is mounted in contact with a bottom surface of the furnace body.

16. The single crystal furnace of claim 12, wherein the spill tray is mounted on an inner side wall of the furnace body.

* * * * *